US008169350B2

(12) United States Patent
Oshima et al.

(10) Patent No.: US 8,169,350 B2
(45) Date of Patent: May 1, 2012

(54) ANALOG-DIGITAL CONVERTER CHIP AND RF-IC CHIP USING THE SAME

(75) Inventors: Takashi Oshima, Moriya (JP); Taizo Yamawaki, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 711 days.

(21) Appl. No.: 12/273,240

(22) Filed: Nov. 18, 2008

(65) Prior Publication Data

US 2009/0131010 A1 May 21, 2009

(30) Foreign Application Priority Data

Nov. 20, 2007 (JP) ................................. 2007-300615

(51) Int. Cl.
*H03M 1/10* (2006.01)
*H04B 1/12* (2006.01)
*H04B 1/18* (2006.01)
(52) U.S. Cl. .......................... 341/120; 341/155; 455/334
(58) Field of Classification Search ........................ None
See application file for complete search history.

(56) References Cited

U.S. PATENT DOCUMENTS 5,231,398 A * 7/1993 Topper ........................ 341/156
7,312,734 B2 * 12/2007 McNeill et al. ............... 341/120
7,330,140 B2 * 2/2008 Balakrishnan et al. ........ 341/118
7,783,273 B2 * 8/2010 Maeda et al. .................. 455/285

OTHER PUBLICATIONS

Chiu et al., "Least Mean Square Adaptive Digital Background Calibration of Pipelined Analog-to-Digital Converters", IEEE Transactions on Circuit and Systems I, vol. 51, pp. 38-46 (2004).
Oshima et al., "Fast Digital Background Calibration for Pipelined A/D Converters", IEICE Technical Report, VLD2006-138, ICD2006-229, pp. 115-120 (2007).

* cited by examiner

*Primary Examiner* — Lincoln Donovan
*Assistant Examiner* — Terry L Englund
(74) *Attorney, Agent, or Firm* — Miles & Stockbridge P.C.

(57) ABSTRACT

A wireless receiving circuit having an analog-digital converter of digital calibration type constituted by plural analog-digital converter units, shares portions about digital calibration, and applies the result of calibration of one analog-digital converter unit to other analog-digital converter units to appropriately perform each digital calibration of the plural analog-digital converter units. For example, in a wireless receiving circuit having an analog-digital converter of digital calibration type constituted of an analog-digital converter unit of I side and an analog-digital converter unit of Q side, portions about digital calibration are shared, and a calibration result of I side is applied to Q side.

16 Claims, 16 Drawing Sheets

ANALOG-DIGITAL CONVERTER CHIP AND RF-IC CHIP USING THE SAME

CLAIM OF PRIORITY

The present application claims priority from Japanese Patent Application 2007-300615 filed on Nov. 20, 2007, the content of which is hereby incorporated by reference into this application.

FIELD OF THE INVENTION

The present invention relates to an analog-digital converter chip and an RF-IC chip using it, and more particularly to an analog-digital converter chip and an RF-IC chip using it suited for use in a wireless receiving circuit, a transceiver circuit, and other communication systems.

BACKGROUND OF THE INVENTION

To achieve an analog-digital conversion of high sample rate and high resolution at a low power consumption, an analog-digital converter of digital calibration type has been drawing attention recently. Particularly, as disclosed in Yun Chiu (Y. Chiu et al., "Least mean square adaptive digital background calibration of pipelined analog-to-digital converters," IEEE Transactions on Circuit and Systems I Vol. 51, pp, 38-46 (2004).), and Shun Oshima et al., "ADC Fast Digital Background Calibration of Pipeline Type" Denshi Jouhou Tsuushin Gakkai Electronics Society, Shingaku Gihou VLD2006-138 2007, an analog-digital converter of digital calibration type in combination with a reference analog-digital conversion is expected because it is short in convergence time, and digital calibration of a simple algorithm can be realized.

SUMMARY OF THE INVENTION

To realize analog-digital conversion of a high sample rate and high resolution with a conventional analog-digital converter not performing digital calibration, power consumption increases remarkably because an operational amplifier of broad band and high resolution is required.

On the other hand, recently, demand for broadband wireless increases rapidly, and data rates of wireless LAN and cellular phone continue to become higher.

Particularly, when a data rate exceeds about 100 Mbps, a high sample rate of several hundred Ms/s is required, and, a high resolution of 10 bits or more is also required in order to maintain interference wave tolerance.

To meet the demand to realize such a high-speed, high-resolution analog-digital converter at low power consumption, one idea is to adopt an analog-digital converter of digital calibration type. FIG. 16 shows a construction example considered when, to realize this, a conventional analog-digital converter of digital calibration type is mounted in wireless equipment.

The analog-digital converter, as described above, needs to be digital calibration type, and as an example, the case where an analog-digital converter of digital calibration type using a reference analog-digital converter is used is shown in the drawing.

In FIG. 16, a signal inputted from an antenna 21 is amplified in a low noise amplifier (LNA) 22, then frequency-converted to an intermediate frequency (or zero frequency, hereinafter referred to as a baseband signal) having low I/Q by being multiplied by mixers 23 and 24 by I/Q local oscillation signals that are 90° out of phase with each other that are generated by a voltage-controlled oscillator 25 and a phase synchronous loop 26. The I/O intermediate frequency signals or baseband signals are purged of interfering wave components by filters 27 and 28, respectively, then amplified by variable gain amplifiers 29 and 210, respectively before being inputted to the respective analog-digital converter units of I and Q sides.

An analog-digital converter of digital calibration type of I side includes a main analog-digital conversion section 211, a reference analog-digital conversion section 212, and a digital calibration section 213, and a digital output generation section 214. An analog-digital converter of digital calibration type of Q side includes a main analog-digital conversion section 215, a reference analog-digital conversion section 216, and a digital calibration section 217, and a digital output generation section 218.

The operation of these analog-digital converters of digital calibration type is as follows. Each of output of an analog-digital converter of digital calibration type of I side and output of an analog-digital converter of digital calibration type of Q side is inputted to a demodulation section 219, where modulated data is demodulated. Gains of variable gain amplifiers 29 and 210 are automatically set so that their output voltage amplitudes become equal to or a little smaller than an input dynamic range of I/Q analog-digital converters of digital calibration type.

However, as shown in FIG. 16, when a receiver for a next-generation wireless system having a high data rate is realized by two of the analog-digital converters of digital calibration type for signal processing of I and Q sides, since two reference analog-digital conversion sections and two digital calibration sections are required in addition to the main analog-digital converter, an increase in a circuit area and an increase in power consumption are invited.

Realizing such a fast, high-resolution analog-digital converter at low power consumption is necessary in not only the field of wireless communication also a wired communication field.

A principal solution problem of the present invention is to provide an analog-digital converter chip of a high sample rate and an RF-IC chip wireless receiving circuit that can reduce a circuit area and power consumption occupied by an analog-digital converter.

One of representative items of the present invention is as shown below. Specifically, an analog-digital converter chip comprising an analog-digital converter of digital calibration type having a plurality of analog-digital converter units of digital calibration type, wherein the plurality of analog-digital converter units of digital calibration type are formed on a common chip, wherein the plurality of analog-digital converter units of digital calibration type share one reference analog-digital conversion section and one digital calibration section, and wherein each digital calibration of the plurality of analog-digital converter units is performed by applying the result of calibration performed for the one analog-digital converter unit of digital calibration type by the reference analog-digital conversion section and the digital calibration section to the other analog-digital converter unit of digital calibration type.

The present invention contributes to a great reduction in circuit area and current consumption of an analog-digital converter of digital calibration type necessary for a next-generation wireless receiver of high data rate.

DETAILED DESCRIPTION OF THE PREFERRED EMBODIMENTS

According to a representative embodiment of the present invention, in a wireless receiving circuit having an analog-digital converter of digital calibration type constituted by plural analog-digital converter units, each digital calibration of the plural analog-digital converter units is appropriately performed by sharing portions about digital calibration and applying the calibration result of the one analog-digital converter unit to the other analog-digital converter unit.

For example, only an analog-digital converter of digital calibration of I side has a reference analog-digital conversion section and a digital calibration section, the I side operates as a normal analog-digital converter of digital calibration type, and performs an inner product operation between an output code value of the main analog-digital converter unit of I side and weight vector $W_i$ outputted from the digital calibration section in the digital output generation section of I side. The Q side performs an inner product operation between an output code value of the main analog-digital converter unit of Q side and the weight vector $W_i$ outputted from the digital calibration section in the digital output generation section of Q side. Thereby, without needing the reference analog-digital conversion of Q side and the digital calibration section of Q side, like the I side, calibrated output can be obtained from the Q side.

Hereinafter, embodiments of the present invention will be described with reference to the accompanying drawings.

First Embodiment

With reference to FIGS. 1 to 4, a receiver (RX) of a first embodiment of the present invention is described. In this embodiment, the most fundamental idea of the present invention is disclosed.

Figure 1:
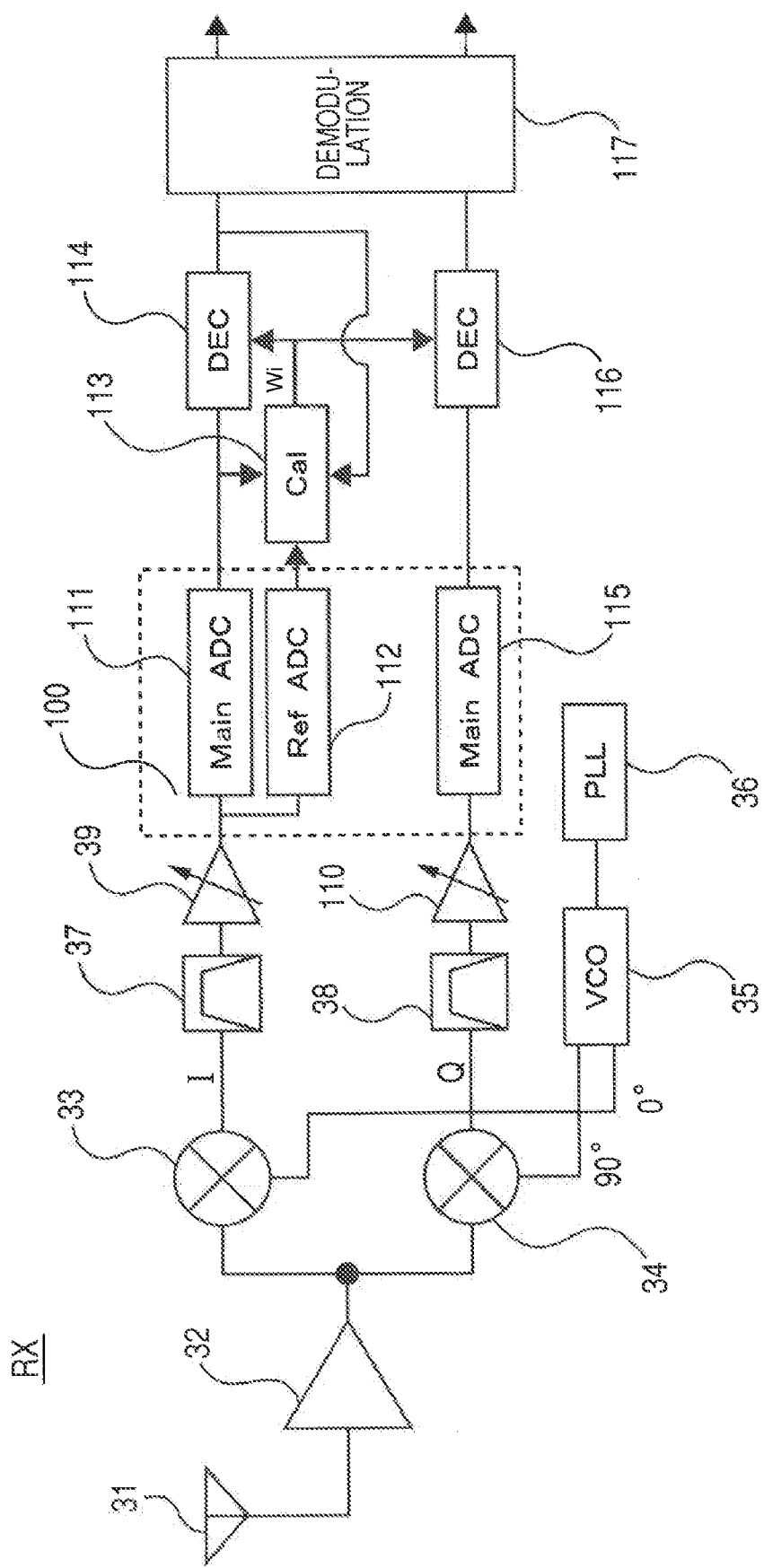
FIG. 1 is a drawing showing the circuit configuration of an analog-digital converter of digital calibration type of a first embodiment of the present invention.

FIG. 1 is a drawing showing a circuit construction of the receiver of the first embodiment. In this embodiment, an analog-digital converter of digital calibration type of this embodiment includes one analog-digital converter unit of digital calibration type of I side and an analog-digital converter unit of digital calibration type of Q side. The analog-digital converter unit of I side, like conventional analog-digital converters of digital calibration type, includes one main analog-digital conversion section 111, one reference analog-digital conversion section 112, a digital calibration section 113, and a digital output generation section 114. On the other hand, the analog-digital converter unit of digital calibration type of Q side includes only one main analog-digital conversion section 115 and a digital output generation section 116, and has no reference analog-digital conversion section and digital calibration section. 100 designates an analog-digital converter (ADC) chip constituting an analog-digital converter, and at least the main analog-digital conversion section 111 constituting an analog-digital converter unit of I side and the main analog-digital conversion section 115 constituting an analog-digital converter unit of Q side are formed on the same IC chip. If there are no constraints on layout, the reference analog-digital conversion section 112, the digital calibration section 113, and the digital output generation section 114 may be formed on the same ADC chip. Conversely, these may be formed on an IC chip different from that of a main analog-digital conversion section. The analog-digital converter 100 may be mounted in an RF-IC chip.

A signal inputted to the receiver from an antenna 31 is amplified in a low noise amplifier (LNA) 32, then frequency-converted to an intermediate frequency (or zero frequency, hereinafter referred to as a baseband signal) having low I/Q by being multiplied by mixers 33 and 34 by I/Q local oscillation signals that are 90° out of phase with each other that are generated by a voltage-controlled oscillator 35 and a phase synchronous loop 36. The I/O intermediate frequency signals or baseband signals are purged of interfering wave components by filters 37 and 38, respectively, then amplified by variable gain amplifiers 39 and 110, respectively before being inputted to the respective analog-digital converter units of I and Q sides.

The analog-digital converter unit of digital calibration type of I side operates as normal analog-digital converter of digital calibration type. That is, the main analog-digital conversion section 111 of I side performs low accuracy conversion at a high sample rate equal to a sample rate as an analog-digital converter of digital calibration type, and outputs an output code value. An inner product operation between the output code and a weight vector $W_i$ outputted from the digital calibration section 113 is performed in a digital output generation section 114 of I side. The digital calibration section 113, to generate the above-described weight vector, as a reference input signal, refers to output of the reference analog-digital conversion section 112 that performs high accuracy conversion at a low sample rate.

On the other hand, the analog-digital converter unit of digital calibration type of Q side can obtain calibrated output like the I side without needing the reference analog-digital conversion section of Q side and the digital calibration section of Q side by performing an inner product operation between an output code value of the main analog-digital conversion section 115 of Q side and the above-described weight vector $W_i$ outputted from the digital calibration section 113 of I side in the digital output generation section 116 of Q side.

Output of the analog-digital converter unit of digital calibration type of I side and the analog-digital converter unit of digital calibration type of Q side each are inputted to a demodulation section 117, where modulated data is demodulated.

Gains of the variable gain amplifiers 39 and 110 are automatically set so that their output voltage amplitude is equal to or somewhat smaller than an input dynamic range of the analog-digital converter unit of I/Q digital calibration type. The filters 37 and 38 are achieved by a band pass filter centering on an immediate frequency when it is not zero, and by a low pass filter when zero (in the case of direct conversion).

Figure 2:
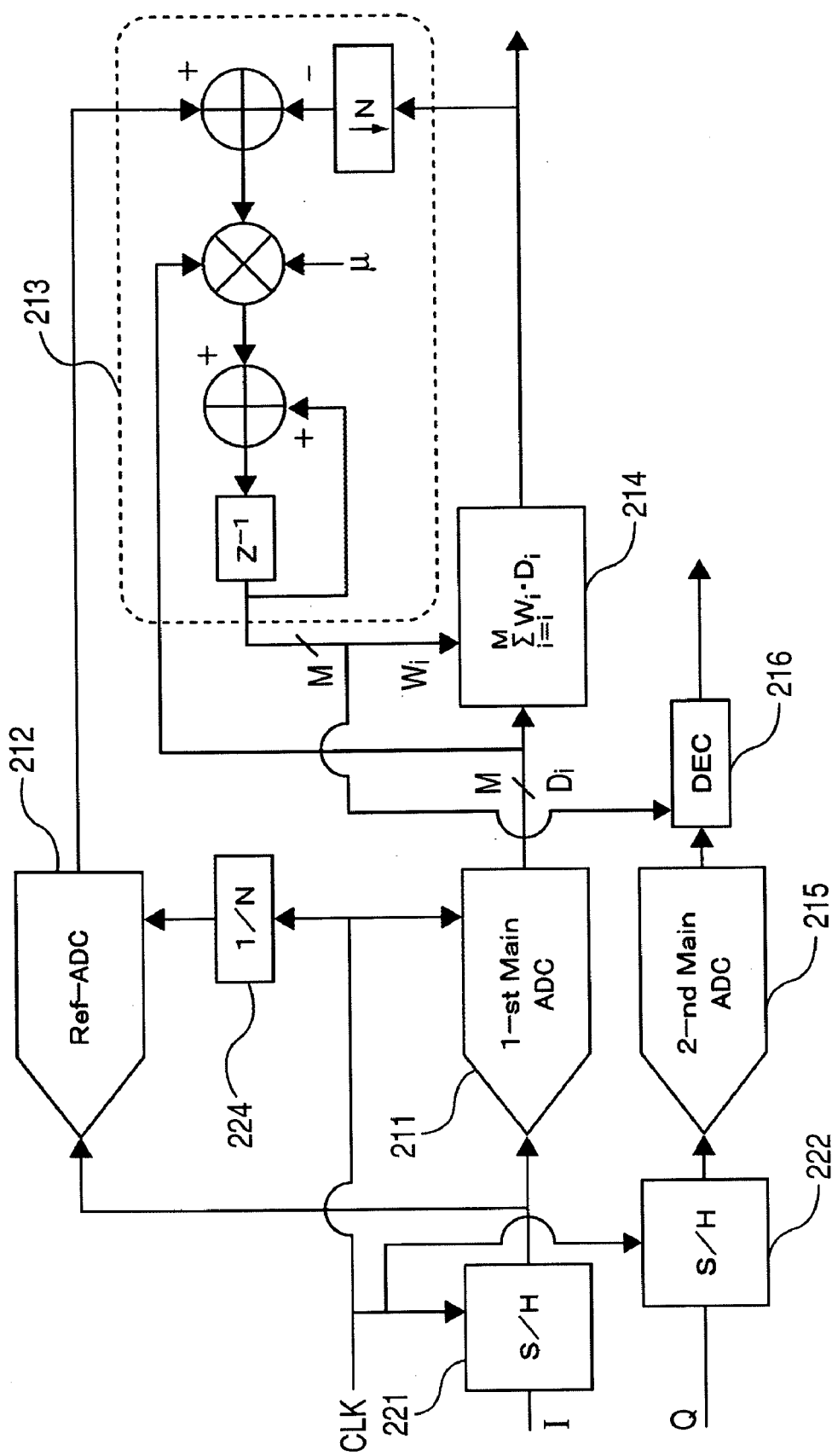
FIG. 2 is a drawing showing the circuit configuration of an analog-digital converter unit of digital calibration type of a first embodiment.

FIG. 2 shows an example of more concrete construction of the analog-digital converter of digital calibration type of the first embodiment. Sample and hold circuits (S/H) 221 and 222 repeatedly sample and hold input analog signals (I, Q) synchronously with a CLK signal. A main analog-digital conversion section 211 constituting the analog-digital converter unit of I side, and the reference analog-digital conversion section 212 are connected to output of the sample and hold circuit 221, and convert held voltage values of I side into digital values respectively for output to a digital output generation section 214. A main analog-digital conversion section 215 constituting the analog-digital converter unit of Q side is connected to output of the sample and hold circuit 222, and converts held voltage values of Q side into digital values for output to a digital output generation section 216.

The main analog-digital conversion section 211 is achieved by a normal analog-digital converter of pipeline type, and the reference analog-digital conversion section 212 is achieved by a normal analog-digital converter of pipeline type, an algorithmic analog-digital converter, or an analog-digital converter of sigma delta type. The sample and hold circuit 221 and the main analog-digital conversion section 211 operate synchronously with a CLK signal having a frequency equal to a sample rate, while the reference analog-digital conversion section 212 operates synchronously with a low-frequency CLK signal generated by frequency-dividing the CLK signal by 1/N by a frequency divider (1/N) 224. When the sample rate is high, although the main analog-digital conversion section 211 must operate at a high CLK frequency, it does not need to have a high accuracy because its output can be corrected by digital calibration by the digital calibration section 213. Therefore, although an operational amplifier as the nucleus of the main analog-digital conversion section 211 is required to have a wide band, it can be realized at relatively small power consumption because high gain is not required.

On the other hand, although the reference analog-digital conversion section 212 must have high accuracy to afford a reference value during digital calibration, it can be realized with small power consumption because of the low CLK frequency as described above. M-bit output code of the main analog-digital conversion section 211 is converted to a digital value by the digital output generation section 214, and outputted as output of an analog-digital converter of digital calibration type. The digital output generation section 214, for example, as disclosed in the above Shun Oshima et al., performs an inner product operation between output code of the main analog-digital converter 211 and weight vector $W_i$ outputted from the digital calibration section 213. Adding higher-order correction items such as $W_i^{(2)}*D_i^2$ and $W_i^{(3)}*D_i^2$, further increases output accuracy.

The digital calibration section 213 forms a negative feedback loop by taking a difference between output of the digital output generation section 214 and output of the reference analog-digital conversion section 212 and updating the value of current $W_i$ based on the result. Thereby, since output of the digital output generation section 214 becomes equal to output of the reference analog-digital conversion section 212, the value of weight $W_i$ is automatically controlled.

The analog-digital converter unit of digital calibration type of Q side performs an inner product operation between an output code value of the main analog-digital conversion section 215 and a weight vector $W_i$ outputted from the digital calibration section 213 of I side in the digital output generation section 216 of Q side. Thereby, like I side, calibrated output can be obtained.

This embodiment assumes that an analog circuit (particularly operational amplifier) within the main analog-digital conversion section 211 of I side and an analog circuit within the main analog-digital conversion section 215 of Q side match with good specific accuracy. In this case, it is used that digital output can be generated by weight coefficient $W_i$ common between the I and Q sides. Such a satisfactory matching can be expected sufficiently from present integrated circuit technology.

Specifically, in this embodiment, to effectively deliver the effect of digital calibration, corresponding analog circuit blocks of individual main analog-digital conversion sections are laid out to be positioned near to each other. In other words, the individual main analog-digital conversion sections are constructed to be on the same IC chip under the same environment within an allowable range.

Figure 3:
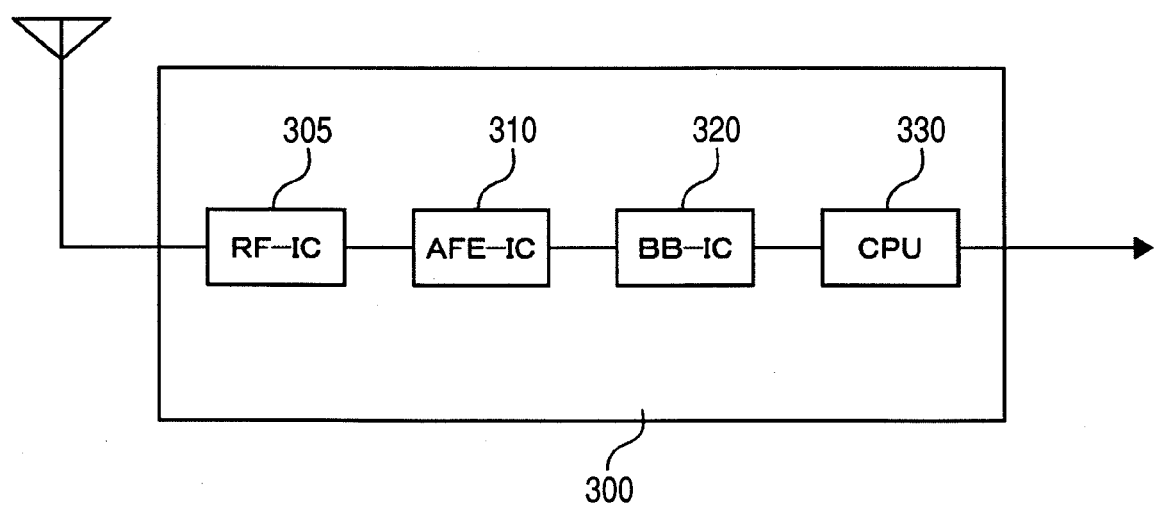
FIG. 3 is a drawing a construction example of a receiver based on a first embodiment.

For example, as shown by a construction of a receiver of FIG. 3, the main analog-digital conversion section of I side and the main analog-digital conversion section of Q side that constitute each analog-digital converter unit are formed in near positions on the same IC chip as an AFE-IC 310. Components of the receiver including other circuits shown in FIG. 1 except an antenna of the receiver, that is, RF-IC section 305, baseband IC 320, and CPU 330, are formed as the same IC chip as AFE-IC 310 or as a different IC chip, and these are formed on a common PCB printed board 300.

Figure 4:
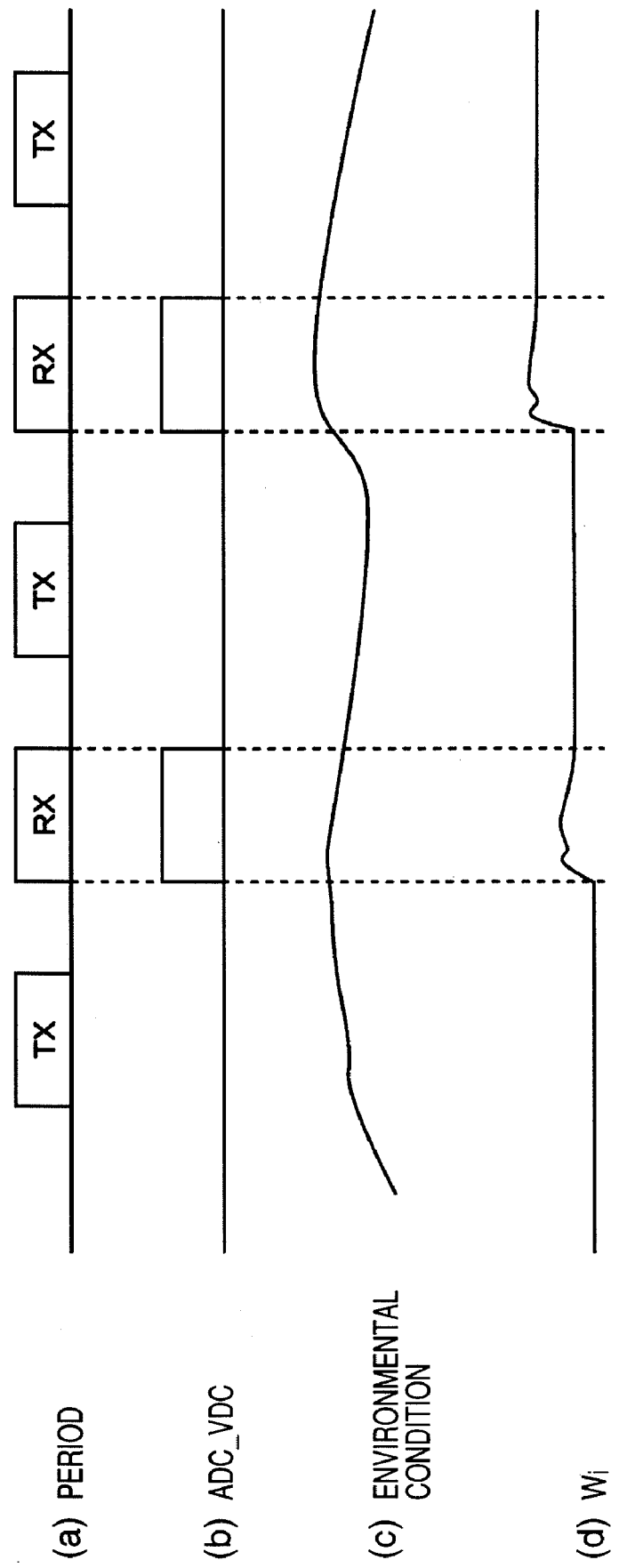
FIG. 4 is a drawing the operation of digital calibration in a wireless transceiver circuit adopting the first embodiment.

The following describes the operation and effect of this embodiment with reference to a time chart of FIG. 4.

An example shown in FIG. 4 shows both analog-digital converter units of I and Q sides including a main analog-digital conversion section that are formed on the same RF-IC, and the operation of digital calibration in a wireless transceiver that perform communication in the TDD (Time Division Duplex) system. In FIG. 4, (a) shows periods TX and RX of transmission/reception signals by the TDD system, (b) shows on/off state of an analog-digital converter corresponding to transmission/reception signals, (c) shows time transition of environmental conditions of wireless transceiver circuit, particularly RF-IC, such as atmosphere temperature and power voltage, and (d) shows weight vector $W_i$ outputted from the digital calibration section 213, corresponding to change in the above-described environmental conditions. Power voltage VDD of both analog-digital converter unit of I and Q sides is turned on only during a reception period Rx of a TDD signal. As a result, digital calibration reflecting change in environmental conditions of a wireless reception circuit is performed by the digital calibration section 213 only during the reception period Rx, the weight vector $W_i$ is updated, and the immediately preceding weight vector $W_i$ is maintained in other periods. In this way, digital calibration of the analog-digital converter units of I and Q sides is performed to meet environments of the wireless transceiver circuit.

According to this embodiment, since the analog-digital converter unit of digital calibration type of I side adopts a normally updated weight vector $W_i$ for calibration, its output is steadily highly accurate. On the other hand, since the analog-digital converter unit of digital calibration type of Q side adopts weight vector $W_i$ of the analog-digital converter unit of I side for calibration, its output steadily contains errors. However, the errors are reduced by mounting both the analog-digital converter units in near positions on the same chip and reducing a difference of environmental conditions premised for calibration.

In the analog-digital converter of this embodiment, the main analog-digital conversion section combining one reference analog-digital conversion section may be in either the I or Q side. That is, instead of the example of FIG. 1, it goes without saying that the main analog-digital conversion section constituting the analog-digital converter unit of Q side, the reference analog-digital conversion section, and the main analog-digital conversion section constituting the analog-digital converter unit of I side may constitute one analog-digital converter of digital calibration type, with the same operation and effect.

In this way, according to this embodiment, when an analog-digital converter of digital calibration type of a next-generation wireless receiver having a high data rate is realized using an analog-digital converter of digital calibration type for signal processing of I and Q sides, since the reference analog-digital conversion section and the digital calibration section cab singly obtain appropriately calibrated output, a circuit area and current consumption are greatly reduced.

Second Embodiment

Although, in the first embodiment, only the analog-digital converter unit of either of I and Q sides includes the reference analog-digital conversion section, the analog-digital converter units of I and Q sides may alternately use one reference analog-digital conversion section for digital calibration.

Figure 5:
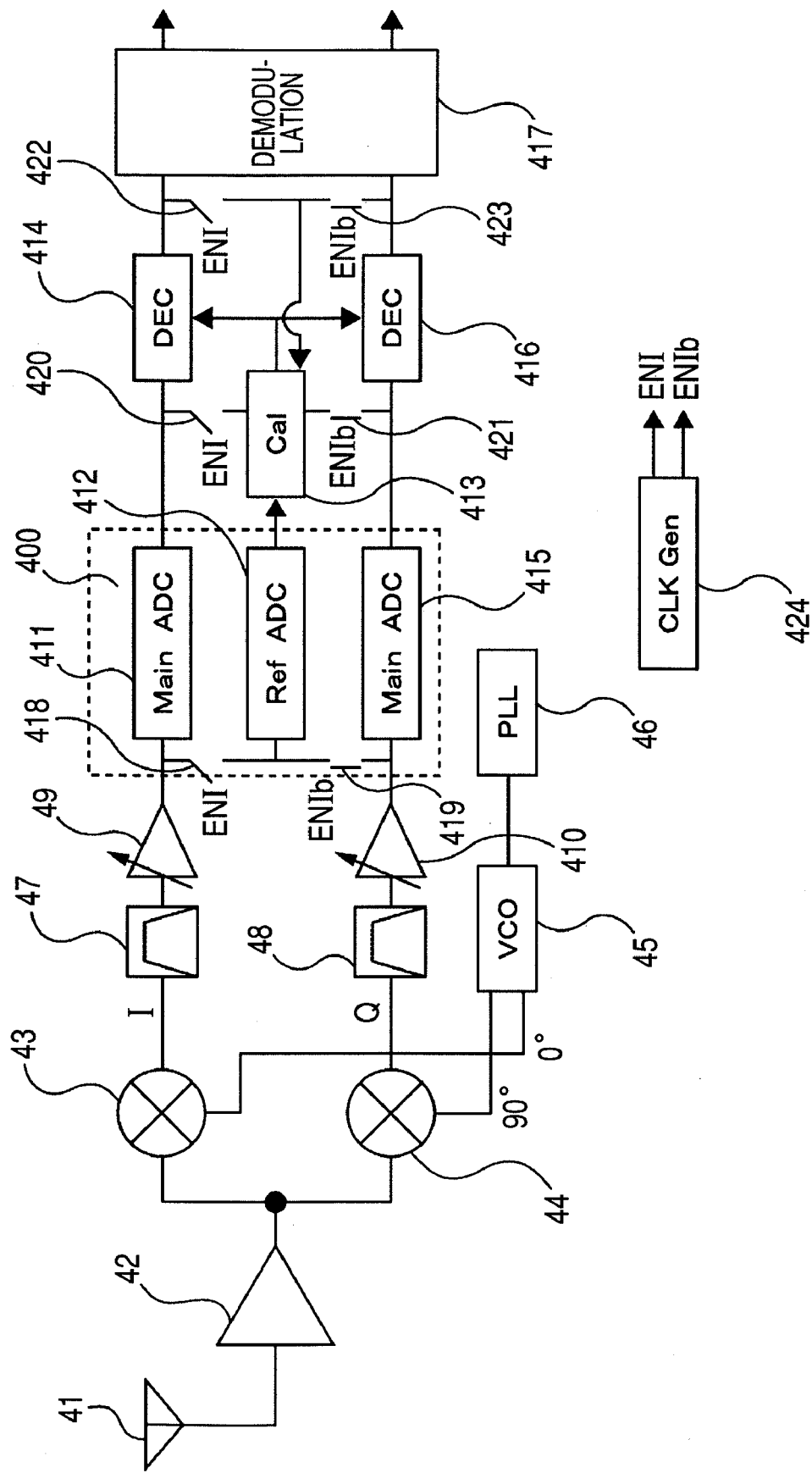
FIG. 5 is a drawing showing the circuit construction of an analog-digital converter unit of digital calibration type of a second embodiment of the present invention.
Figure 6:
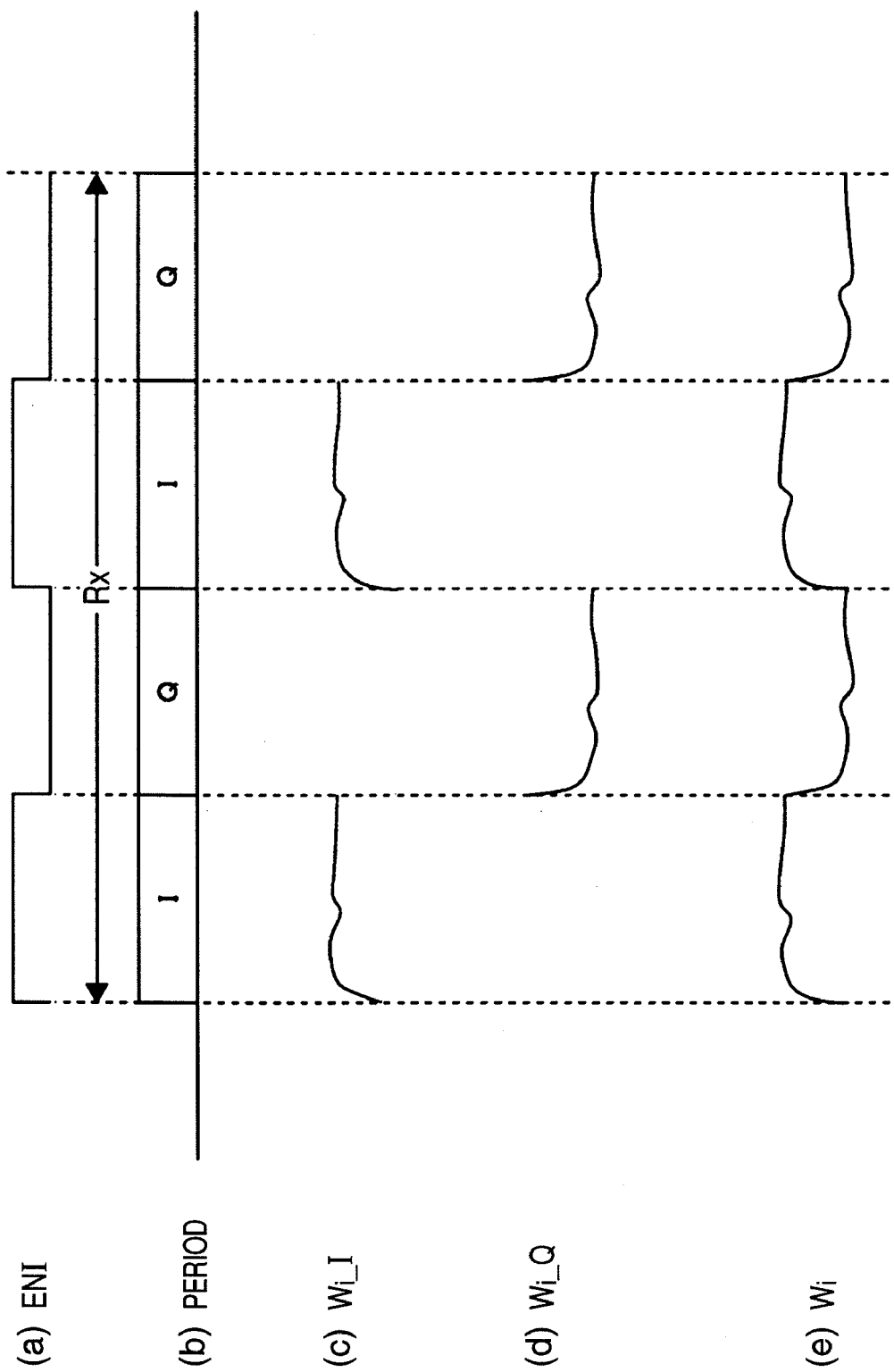
FIG. 6 is a time chart showing the operation of a second embodiment.

FIGS. 5 and 6 show a second embodiment of the present invention. This embodiment discloses an example of measures for insufficient matching accuracy between both analog circuits within the main analog-digital conversion sections of I and Q sides. FIG. 5 is a drawing showing a circuit construction of a receiver of the second embodiment of the present invention. In FIG. 5, 400 designates an IC chip (ADC chip) of an analog-digital converter of digital calibration type, and at least a main analog-digital conversion sections 411 and 415, of the main analog-digital conversion section 411 constituting an analog-digital converter unit of I side, the main analog-digital conversion section 415 constituting an analog-digital converter unit of Q side, and a reference analog-digital conversion section 412 and a digital calibration section 413 that are common to both are formed on the same IC chip 400. The analog-digital converter 400 may be mounted in the RF-IC chip.

In FIG. 5, a signal inputted from an antenna 41 is amplified in a low-noise amplifier (LNA) 42, and frequency-converted to an intermediate frequency (or zero frequency, hereinafter referred to as a baseband signal) having low I/Q by being multiplied by mixers 43 and 44 by I/Q local oscillation signals that are 90° out of phase with each other that are generated by a voltage-controlled oscillator 45 and a phase synchronous loop 46. The I/O intermediate frequency signals or baseband signals are purged of interfering wave components by filters 47 and 48, respectively, then amplified by variable gain amplifiers 49 and 410, respectively before being inputted to the respective analog-digital converter units of I and Q sides.

The analog-digital converter unit of digital calibration type of I side includes the main analog-digital conversion section 411 and a digital output generation section 414. The analog-digital converter unit of digital calibration type of Q side includes a main analog digital conversion section 415 and a digital output generation section 416. To perform alternate digital calibration between I and Q sides, the reference analog-digital conversion section 412 and the digital calibration section 413 are included.

In this embodiment, an ENI signal (I-side enable signal) and an ENIb signal (reverse signal of ENI signal) generated by the CLK generation section 424 control open/close of SWs 418, 419, 420, 421, 422, and 423. When the ENI signal is High voltage, the SWs 418, 420, and 422 go on, and the SWs 419, 421, and 423 go off. Thereby, an input part of the reference analog-digital conversion section 412 is connected in parallel to an input part of the main analog-digital conversion section 411 of I side, and output of the main digital conversion section 411 of I side and output of the digital output generation section 414 of I side each are connected to the digital calibration section 413.

By this construction, one analog-digital converter unit of digital calibration type operates as a conventional analog-digital converter unit of digital calibration type as described previously, and the digital calibration section 413 outputs an appropriate weight coefficient $W_i$ corresponding to the characteristics of an analog circuit (particularly operational amplifier) within the main analog-digital conversion section 411 of I side. By performing an inner product operation between an output code value of the main analog digital conversion section 411 of I side and the weight coefficient in the digital output generation section 414 of I side, a correct output of the analog-digital converter unit of digital calibration type of I side is obtained. On the other hand, also as for the analog-digital converter unit of digital calibration type of Q side, by performing an inner product operation between an output code value of the main analog-digital conversion section 415 of Q side and the weight coefficient in the digital output generation section 416 of Q side, output of the analog-digital converter unit of digital calibration type of Q side is obtained.

Since digital calibration of Q side is performed based on a weight coefficient obtained from calibration of I side, when an analog circuit (particularly operational amplifier) within the main analog-digital conversion section 411 of I side and an analog circuit within the main analog-digital conversion section 415 of Q side match with insufficient specific accuracy, output of an analog-digital converter unit of digital calibration type of Q side may deteriorate somewhat. The above operation is defined as operation mode 1 for convenience.

When the ENI signal is Low voltage, since the ENIb signal is High voltage, the SWs 418, 420, and 422 go off, and the SWs 419, 421, and 423 go on. As a result, an input section of the reference analog-digital conversion section 412 is connected in parallel with an input section of the main analog-digital conversion section 415 of Q side, and output of the main analog-digital conversion section 415 of Q side and output of the digital output generation section 416 of Q side each are connected to the digital calibration section 413.

By this construction, the analog-digital converter unit of digital calibration type of Q side operates as a conventional analog-digital converter unit of digital calibration type as described previously, and the digital calibration section 413 outputs an appropriate weight coefficient $W_i$ corresponding to the characteristics of an analog circuit (particularly operational amplifier) within the main analog-digital conversion section 415 of Q side. By performing an inner product operation between an output code value of the main analog digital conversion section 415 of Q side and the weight coefficient in the digital output generation section 416 of Q side, a correct output of the analog-digital converter unit of digital calibration type of Q side is obtained.

On the other hand, also as for the analog-digital converter unit of digital calibration type of I side, by performing an inner product operation between an output code value of the main analog-digital conversion section 411 of I side and the weight coefficient in the digital output generation section 414 of I side, output of the analog-digital converter unit of digital calibration type of I side is obtained. Since digital calibration of I side is performed based on a weight coefficient obtained from calibration of Q side, when an analog circuit (particularly operational amplifier) within the main analog-digital conversion section 411 of I side and an analog circuit within the main analog-digital conversion section 415 of Q side match with insufficient specific accuracy, output of an analog-digital converter unit of digital calibration type of I side may deteriorate somewhat. The above operation is defined as operation mode 2 for convenience.

In this embodiment, by the CLK generation section 424 changing the ENI/ENIb signal to High or Low as required, the system can transition between the operation mode 1 and the operation mode 2.

FIG. 6 is a time chart showing the operation of this embodiment. (a) shows an ENI signal generated in the CLK generation section 424. (b) shows one reception period RX of a signal by the TDD system. (c) shows weight vector $W_{i\_}$I. (d) shows weight vector $W_{i\_}$Q. (e) shows weight vector $W_i$ of the whole of I and Q. One reception period Rx of a TDD signal is split into plural sections, and the system transitions between the operation mode 1 and the operation mode 2. For each operation mode section, the respective conversion sections of the analog-digital converter units of I and Q sides use output of one reference analog-digital conversion section to alternately perform calibration, and update the weight vectors $W_{i\_}$I and $W_{i\_}$Q, respectively, as shown in (c) and (d). As a result, weight vector $W_i$ as the whole of the analog-digital converter is updated as shown in (e).

Thereby, an error occurring when an analog circuit (particularly operational amplifier) within the main analog-digital conversion section 411 of I side and an analog circuit within the main analog-digital conversion section 415 of Q side match with insufficient specific accuracy can be averaged between the I and Q sides.

For example, as in the first embodiment, when digital calibration is always performed based on the main analog-digital conversion section of I side, although output of the analog-digital converter unit of digital calibration type of I side is steadily highly accurate, output of the analog-digital converter unit of digital calibration type of Q side steadily contains errors.

In contrast to this, in this embodiment, by switching of operation mode by the ENI/ENIb signal, when ENI is High voltage, I-side output is highly accurate and Q-side output contains errors. When ENI is Low voltage, I-side output contains errors, and Q-side output is switched to be highly accurate. In this way, by averaging errors of I-side output and Q-side output for reduction, it is expected that satisfactory characteristics of a wireless receiver can be achieved in comparison with the case where only either steadily contains errors.

The ENI/ENIb signals generated by the CLK generation section 424 may alternately output High voltage and Low voltage at a fixed switching frequency with a duty ratio of 50%, or output High/Low voltage at random. Since frequency components contained in the switching of operation modes are at a low level but spurious components of the receiver, the above-described switching frequency can be selected taking the specifications of the receiver into account.

Output of the analog-digital converter unit of digital calibration type of I side and output of the analog-digital converter unit of digital calibration type of I side each are inputted to a demodulation section 417, where modulated data is demodulated. Gains of the variable gain amplifiers 49 and 410 are automatically set so that their output voltage amplitudes become equal to an input dynamic range of the analog-digital converter unit of I/O digital calibration type or smaller than it. The filters 47 and 48 are realized by a band pass filter when an intermediate frequency is not zero, and by a low pass filter when an intermediate frequency is zero (for direct conversion).

According to this embodiment, when an analog-digital converter of digital calibration type of the next-generation wireless receiver having a high data rate is realized by an analog-digital converter of digital calibration type for signal processing of I and Q sides, since the reference analog-digital conversion section and the digital calibration section can obtain appropriately calibrated output even singly, the circuit area and current consumption are greatly reduced.

Third Embodiment

The present invention is effective also for adoption to a wireless transceiver circuit in which a receiver including an analog-digital converter of digital calibration type and a transmitter including a power amplifier for power amplification are formed on the same IC chip.

Figure 7:
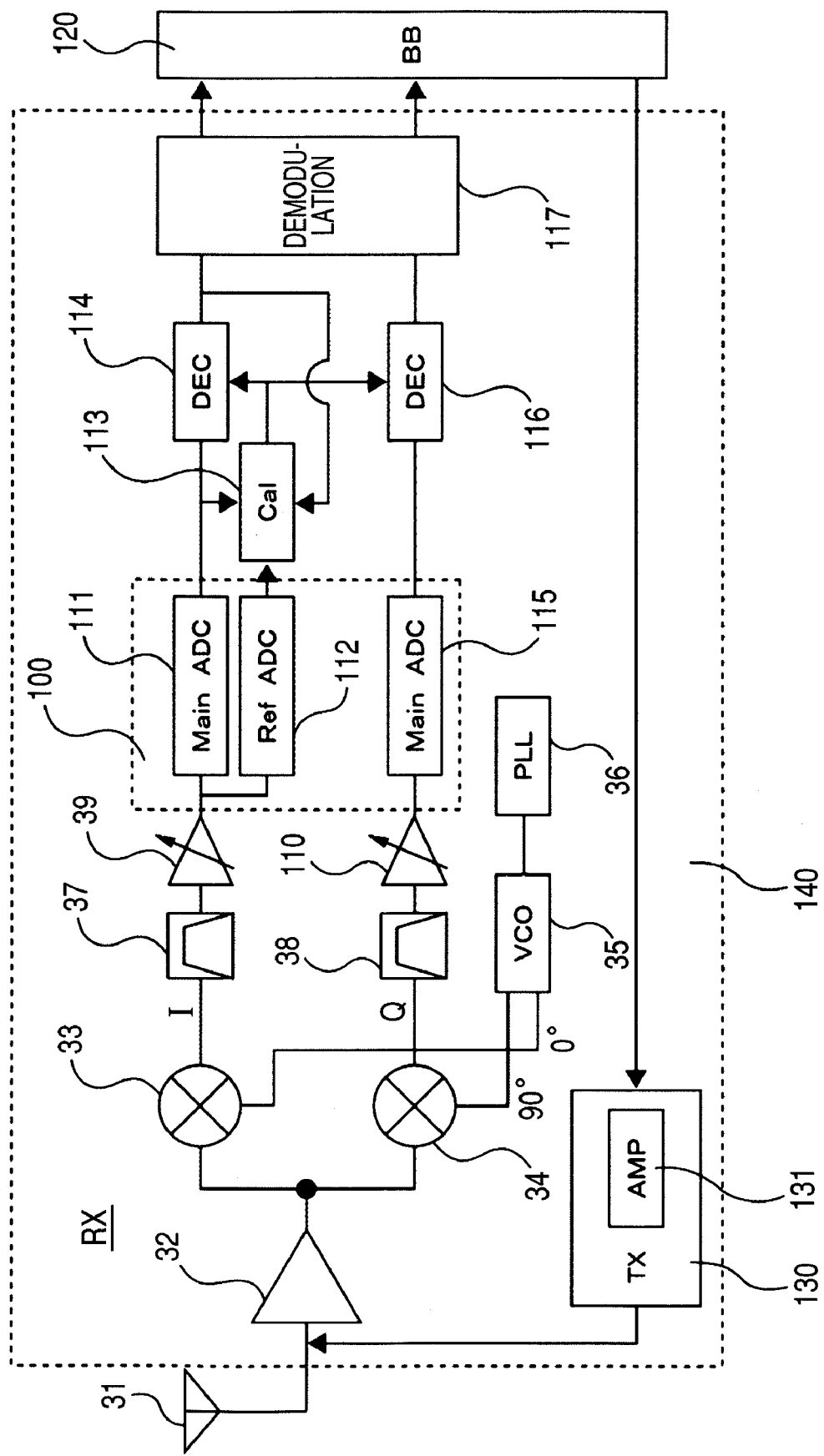
FIG. 7 is a drawing showing the circuit construction of a wireless transceiver of a third embodiment of the present invention.

A third embodiment of the present invention will be described with reference to FIGS. 7 and 8. FIG. 7 is a drawing showing a construction of a wireless transceiver of a third embodiment of the present invention. As shown in FIG. 7, in this embodiment, a transmitter (TX) 130 as well as a receiver (RX) shown in FIG. 1 (or FIG. 5) is formed on one RF-IC chip. 120 is a baseband circuit 120. The transmitter 130 includes at least a power amplifier 131.

When the receiver and the transmitter are formed on the same RF-IC chip, the influence of temperature rise caused by the heat of the power amplifier of the transmitter may be ignored. The temperature rise must be reflected in the digital calibration of the analog-digital converter.

Figure 8:
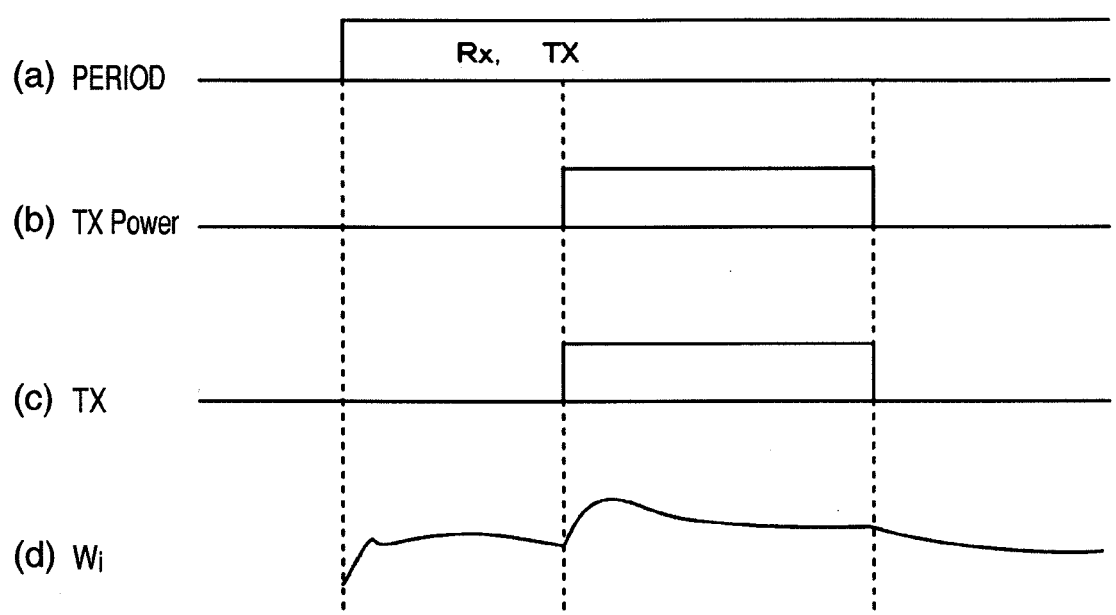
FIG. 8 is a drawing showing the operation of digital calibration when a wireless transceiver circuit of a third embodiment performs communications by the FDD system.

FIG. 8 shows the operation of digital calibration when the wireless transceiver circuit of the third embodiment performs communication by the FDD (Frequency Division Duplex) system. In FIG. 8, (a) shows communication period by FDD, (b) shows states of power of the transmitter TX, (c) shows operating states of the transmitter TX (power amplifier), and (d) shows weight vector $W_i$.

According to this embodiment, the weight vector $W_i$ is continuously updated by digital calibration of the analog-digital converter of the receiver. Therefore, even when power of the transmitter TX goes on, the power amplifier of the transmitter goes on, and atmospheric temperature of the receiver (RX) also rises temporarily, the weight vector $W_i$ is updated according to a rise in atmospheric temperatures.

Therefore, according to this embodiment, since the receiver may have one reference analog-digital converter and one digital calibration section, circuit area and current consumption are greatly reduced, and output of the analog-digital converter of digital calibration type is kept highly accurate regardless of operating states of the transmitter.

Fourth Embodiment

A fundamental concept of the present invention can be applied not only to an I-side analog-digital converter unit and Q-side analog-digital converter unit for I/Q signal processing of a wireless receiver as described in the first and the second embodiments also generally in a system (analog-digital converter) including plural identical analog-digital converter units. In this embodiment, as an example, the case of applying the present invention to an analog-digital converter of time interleave type is shown.

Figure 9:
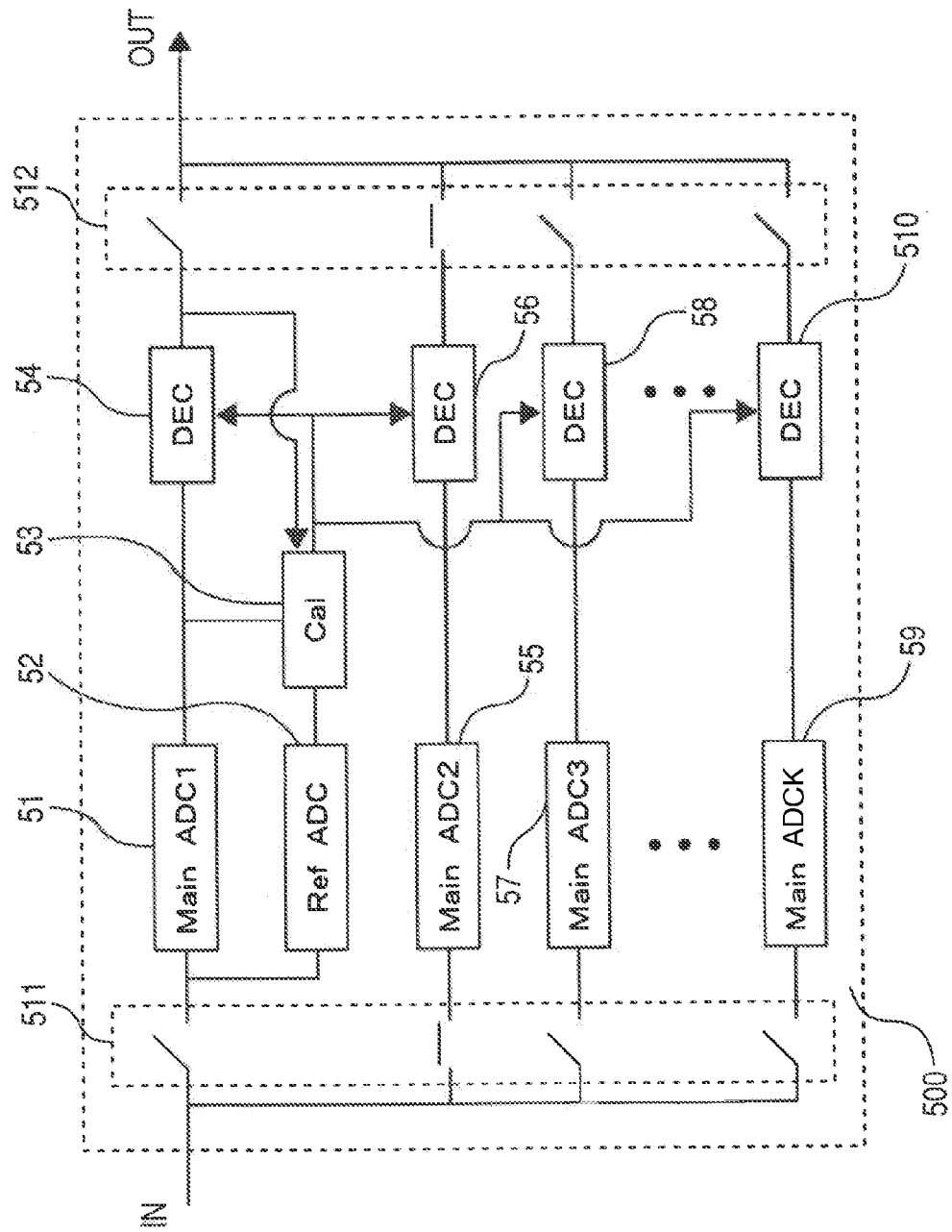
FIG. 9 is a drawing showing the circuit construction of an analog-digital converter of time interleave type of a fourth embodiment of the present invention.

The fourth embodiment of the present invention will described with reference to FIGS. 9 and 10. The analog-digital converter of time interleave type 500 to which the present invention is applied, as shown in FIG. 9, includes K identical analog-digital converter units that operate at operation clocks 1/K out of phase with each other that are connected in parallel in terms of input. By this construction, a sample rate K times a sample rate of each analog-digital converter unit can be achieved on the whole. By constituting these analog-digital converter units as a single as described below, an analog-digital converter of digital calibration type is achieved.

Specifically, as shown in FIG. 9, a first analog-digital converter unit of digital calibration type includes a main analog-digital conversion 51, a reference analog-digital conversion section 52, one digital calibration section 53, and a digital output generation section 54. A second analog-digital converter unit of digital calibration type includes a main analog-digital conversion section 55 and a digital output generation section 56. A third analog-digital converter unit of digital calibration type includes a main analog-digital conversion 57 and a digital output generation section 58. The middle sections are omitted, and K analog-digital converter unit of digital calibration type includes a main analog-digital conversion section 59 and a digital output generation section 510. Output of the digital calibration section 53 is also supplied to the second and following digital output generation sections.

Figure 10:
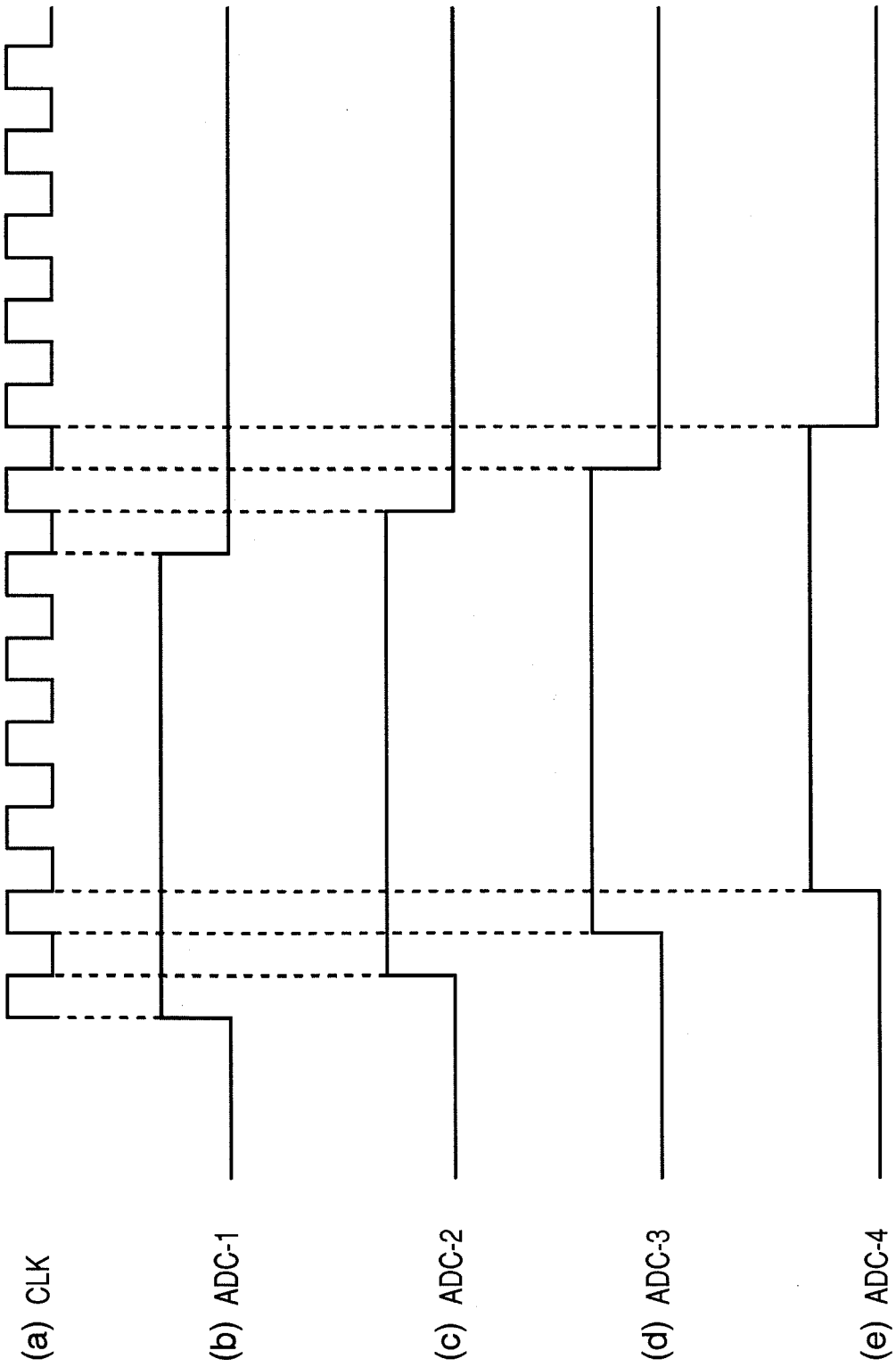
FIG. 10 is a time chart showing the operation of a fourth embodiment.

As shown in a time-chart of FIG. 10, K (e.g., K=4) identical analog-digital converter units ADC-1 to ADC-4 operate at operation clocks that are 1/K out of phase with each other, synchronously with a low-frequency CLK signal produced by frequency-dividing the CLK signal.

In this embodiment, like a general analog-digital converter of time interleave type, before and after each of paralleled analog-digital converter units of digital calibration type, a multiplexer 511 and a demultiplexer 512 are disposed, and an analog-digital converter units of digital calibration type currently being processed is selected. A sample hold circuit may be provided in the portion of the multiplexer 511 of input side (omitted from the drawing).

The first analog-digital converter unit of digital calibration type operates as described previously as an analog-digital converter of digital calibration type. Specifically, the first main analog-digital conversion section 51 performs low-accuracy conversion at a high sample rate equal to a sample rate as an analog-digital converter unit of digital calibration type, and outputs an output code value. An inner product operation between the output code and weight vector $W_i$ outputted from the digital calibration section 53 is performed in the first digital output generation section 54. The digital calibration section 53 refers to output of the reference analog-digital conversion section 52 that performs highly accurate conversion at a low sample rate, as a reference input signal, to generate the above-described weight vector.

The second analog-digital converter unit of digital calibration type performs an inner product operation between an output code value of the second analog-digital conversion section 55 and the weight vector $W_i$ outputted from the digital calibration section 53 in the second digital output generation section 56. Thereby, appropriately calibrated output can be obtained without needing the second dedicated analog-digital converter and the digital calibration section. The operations of the third and following analog-digital converter units of digital calibration type are the same as that of the second analog-digital converter unit of digital calibration type.

This embodiment assumes that an analog circuit (particularly an operational amplifier) within the main analog-digital conversion section 51 of the first analog-digital converter unit and the main analog-digital conversion sections 55, 57, and 59 of the second and following analog-digital converter units of digital calibration type match with good specific accuracy, and therefore these are constructed on a common IC chip. By this construction, this embodiment uses that the first analog-digital converter unit and the second and following analog-digital converter units can generate digital output with the common weight coefficient $W_i$. Such a satisfactory matching can be expected sufficiently from present integrated circuit technology.

According to this embodiment, since both the circuit area and current consumption of analog-digital converter of time interleave type are greatly reduced, and appropriately calibrated output can be obtained, output of the analog-digital converter is kept highly accurate.

Fifth Embodiment

Although, in the above-described embodiments, the case where one digital calibration section and one reference analog-digital conversion section are shared is disclosed, the fundamental concept of the present invention can be applied for two or more digital calibration sections and two or more reference analog-digital conversion sections.

For example, although, in the fourth embodiment, as an example, an analog-digital converter unit of time interleave type includes one digital calibration section, when there are many analog-digital converter units, corresponding digital calibration sections may be provided. It goes without saying that all analog-digital converter units may be mounted on the same chip if there are no constraints on layout.

Figure 11:
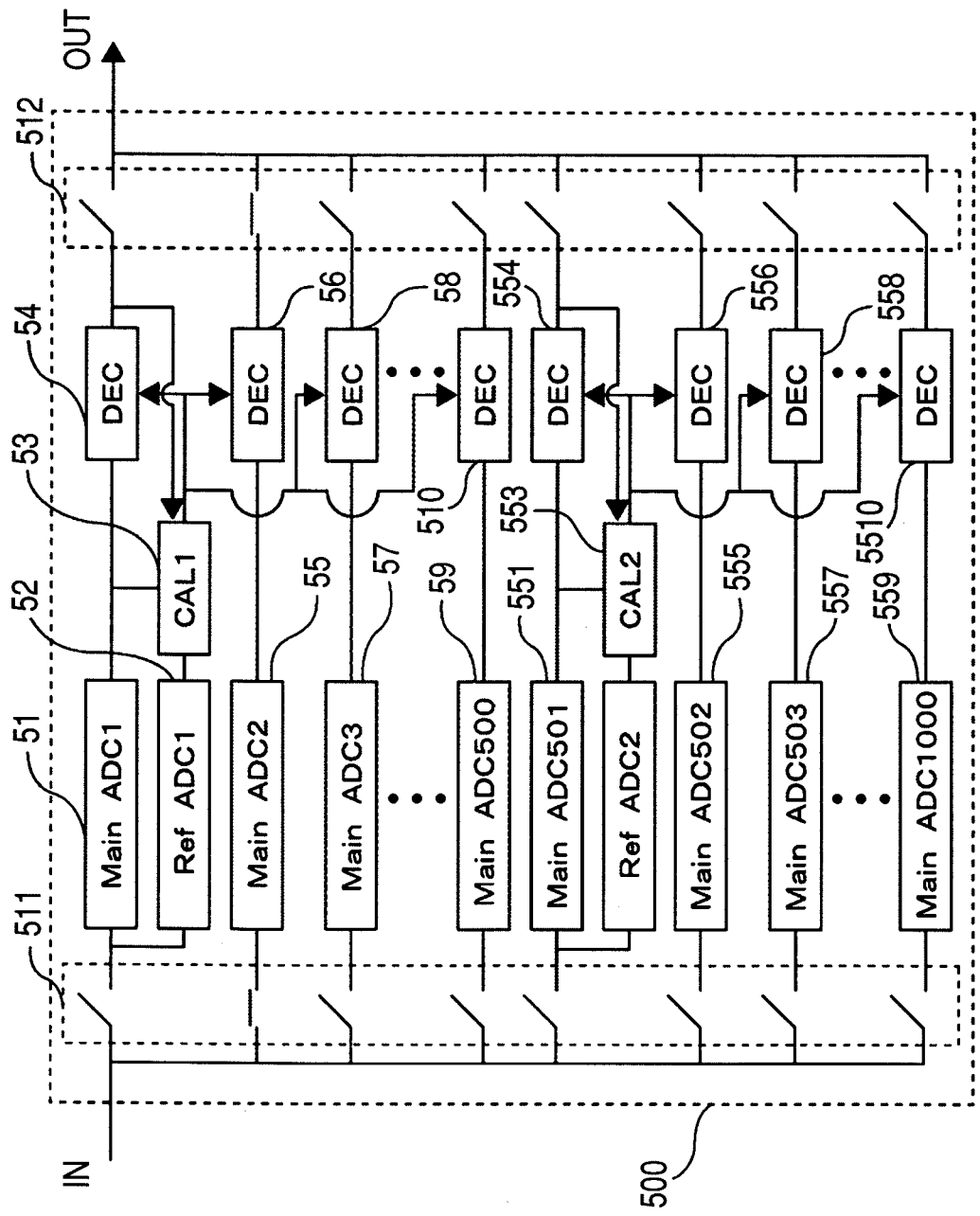
FIG. 11 is a drawing showing the circuit construction of an analog-digital converter of time interleave type of a fifth embodiment of the present invention.

A fifth embodiment of the present invention will be described wit reference to FIG. 11. In this embodiment, an analog-digital converter unit 500 of time interleave type includes 1000 analog-digital converter units of digital calibration type connected in parallel in terms on input, a first digital calibration section 53, and a second digital calibration section 553. The first analog-digital converter unit section and the second to 500-th analog-digital converter units generates digital output with common weight coefficient $W_i$ by the first digital calibration section 53, and the 501-th analog-digital converter unit and the 502-th to 1000 analog-digital converter units can generate digital output with common weight coefficient $W_i$ by the second digital calibration section 553. Such satisfactory matching can be expected sufficiently from present integrated circuit technology.

In this case, when the total number of analog-digital converter units of digital calibration type formed on the common IC chip is N, if the number of the digital calibration sections and the reference analog-digital converter units is even one smaller than N, circuit area and current consumption can be reduced accordingly. To obtain greater effect, it is desirable that the number of digital calibration sections and reference analog-digital conversion sections is e.g., N/2 or less.

Accordingly to this embodiment, both circuit area and current consumption of analog-digital converter of time interleaving type are greatly reduced, and output of an analog-digital conversion section is kept highly accurate.

Sixth Embodiment

Figure 12:
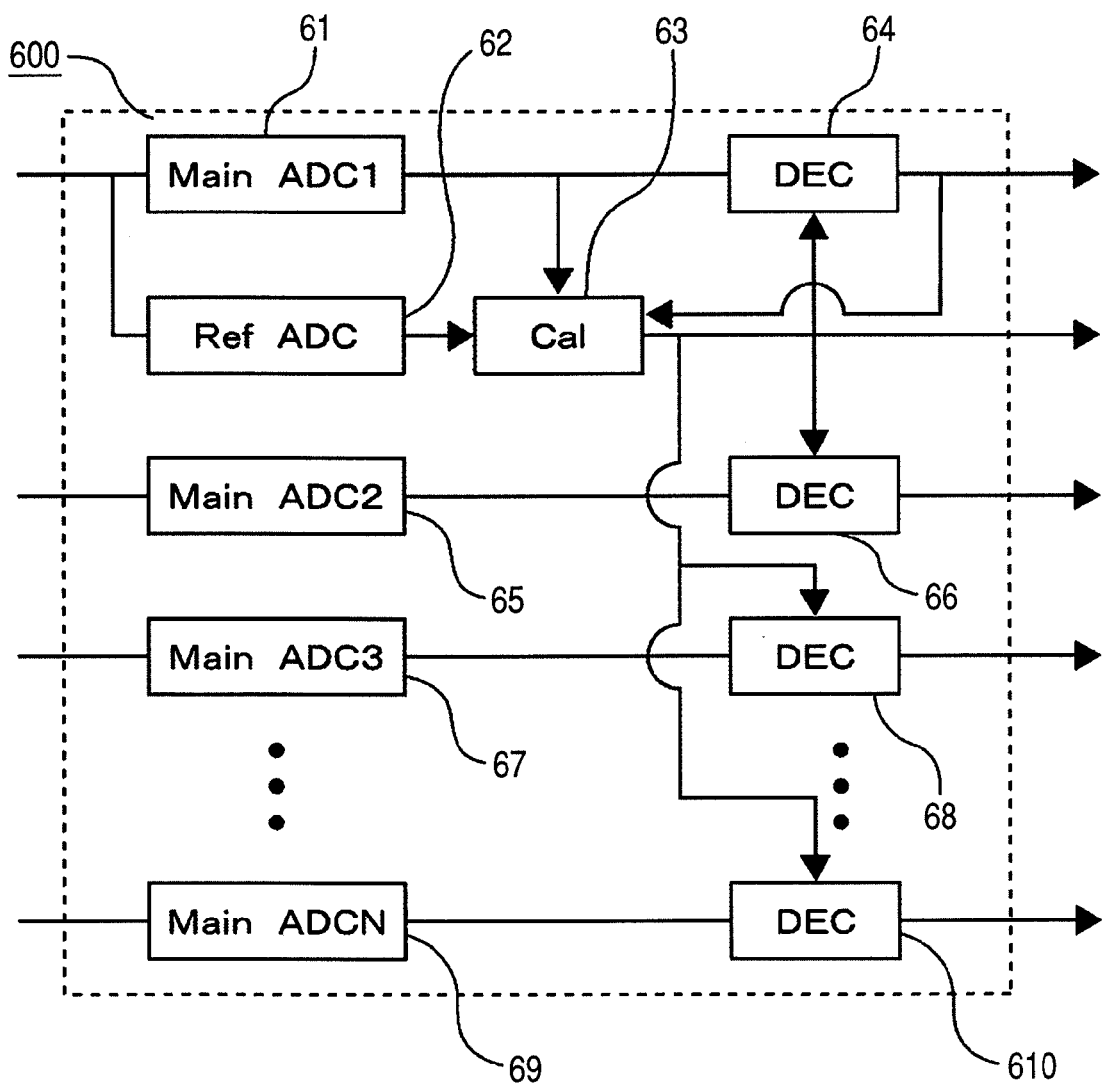
FIG. 12 is a drawing showing the circuit construction of a multi-type analog-digital converter of digital calibration type of a sixth embodiment of the present invention.

The following shows an example applying the present invention to a multi-type analog-digital converter of digital calibration type in which plural analog-digital converters having the same construction in FIG. 12 as a sixth embodiment of the present invention. A fundamental operation of this embodiment is almost the same as that of the third embodiment.

As shown in FIG. 12, this embodiment discloses an example of mounting N same analog-digital converter units of digital calibration type within one IC chip 600. A first analog-digital converter unit of digital calibration type includes a main analog-digital conversion section 61, a reference analog-digital conversion section 62, a digital calibration section 63, and a digital output generation section 64. A second analog-digital converter unit of digital calibration type includes a main analog-digital converter unit 65 and a digital output generation section 66. A third analog-digital converter unit of digital calibration type includes a main analog-digital conversion section 67 and a digital output generation section 68. Reference to the intermediate units is omitted. An N-th analog-digital converter unit of digital calibration type includes a main analog-digital converter unit 69, and a digital output generation section 610. Output of the digital calibration section 63 is also supplied to the second and following digital output generation sections.

The first analog-digital converter unit of digital calibration type operates as described previously as an analog-digital converter unit of digital calibration type. Specifically, the first main analog-digital conversion section 61 performs low-accuracy conversion at a high sample rate equal to a sample rate as an analog-digital converter unit, and outputs an output code value. An inner product operation between the output code and a weight vector $W_i$ outputted from the digital calibration section 63 is performed in the I-th digital output generation section 64. The digital calibration section 63 generates the weight vector by referring to output of the reference analog-digital conversion section 62 that performs highly accurate conversion at a low sample rate as a reference input signal.

The second analog-digital converter unit of digital calibration type performs an inner product operation between an output code value of the second main analog-digital conversion section 65 and the weight vector $W_i$ outputted from the digital calibration 63 in the second digital output generation section 66. Thereby, appropriately calibrated output can be obtained without needing the second dedicated analog-digital converter and the digital calibration section. The operations of the third and following analog-digital converter units of digital calibration type are the same as that of the second analog-digital converter unit of digital calibration type.

The analog-digital converter of this embodiment assumes that an analog circuit (particularly an operational amplifier) within the first analog-digital conversion section 61 of the first analog-digital converter unit and the main analog-digital conversion sections 65, 67, and 69 of the second and following analog-digital converter units of digital calibration type match with good specific accuracy. In this case, the idea that digital output can be generated with the first and second and following common weight coefficient $W_i$ is used.

In the analog-digital converter of digital calibration type of this embodiment, each analog-digital converter unit of digital calibration type is mounted on the same chip. Therefore, sufficiently satisfactory matching can be expected by adopting present integrated circuit technology.

When there are many analog-digital converter units of digital calibration type, like the fifth embodiment, the analog-digital converter units of digital calibration type may be divided to plural groups so that a digital calibration section is provided for each group.

According to this embodiment, since both the circuit area and current consumption of a digital converter of digital calibration type are greatly reduced, and appropriately calibrated output can be obtained, output of the digital converter is also kept highly accurate.

Seventh Embodiment

A seventh embodiment of the present invention will be described with reference to FIGS. 13 and 14. This embodiment is characterized by a layout method on a chip for improving mapping specific accuracy of analog circuits (particularly operational amplifiers) within plural main analog-digital conversion section.

Figure 13:
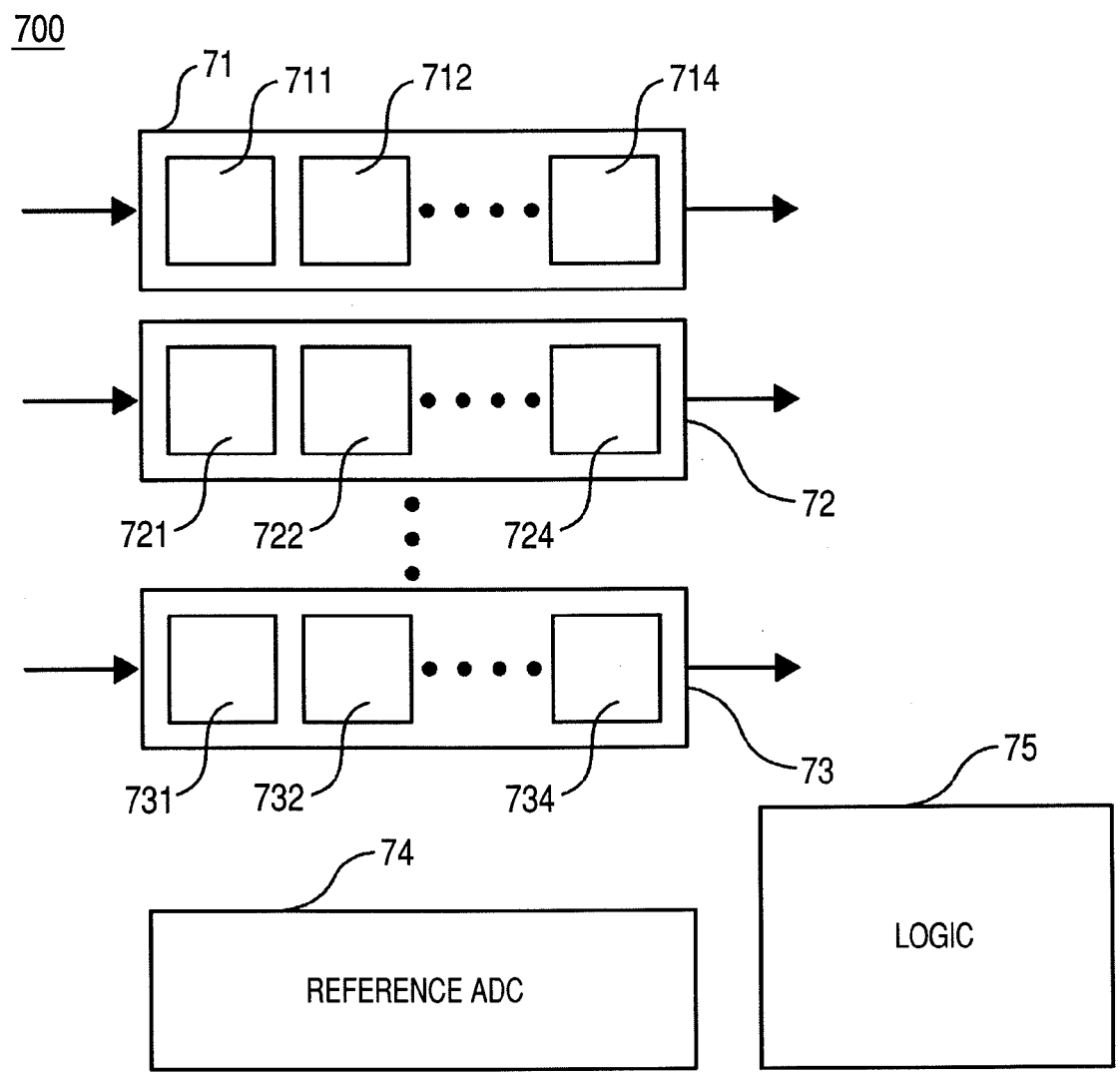
FIG. 13 is a drawing showing an example of a layout method of an analog circuit on a chip of a seventh embodiment.

As shown in FIG. 13, an analog-digital converter of digital calibration type 700 includes plural main analog-digital conversion sections 71, 72, and 73 formed on the same chip, one reference analog-digital conversion section 74, and a logical section 75 including a digital output generation section and a digital calibration section.

Each main analog-digital conversion section is realized by an analog-digital conversion section of pipeline type. The analog-digital conversion section of pipeline type has a necessary number of stages of basic blocks called MDC (Multiplying DAC) connected in series according to necessary resolution. MDC includes switched capacitor circuit centering on an operational amplifier.

For example, in the main analog-digital conversion section 71, from a first stage to a last stage, a MDAC 711, a MDAC 712, . . . , and a MDAC 714 are connected in series. Although not shown in the drawing, output of the last stage MDAC 714 terminates with a block called sub ADC. Likewise, in the main analog-digital conversion section 72, a MDAC 721, a MDAC 722, . . . , and a MDAC 724 are connected in series, and in the main analog-digital conversion section 73, a MDAC 731, a MDAC 732, . . . , and a MDAC 734 are connected in series.

Figure 14:
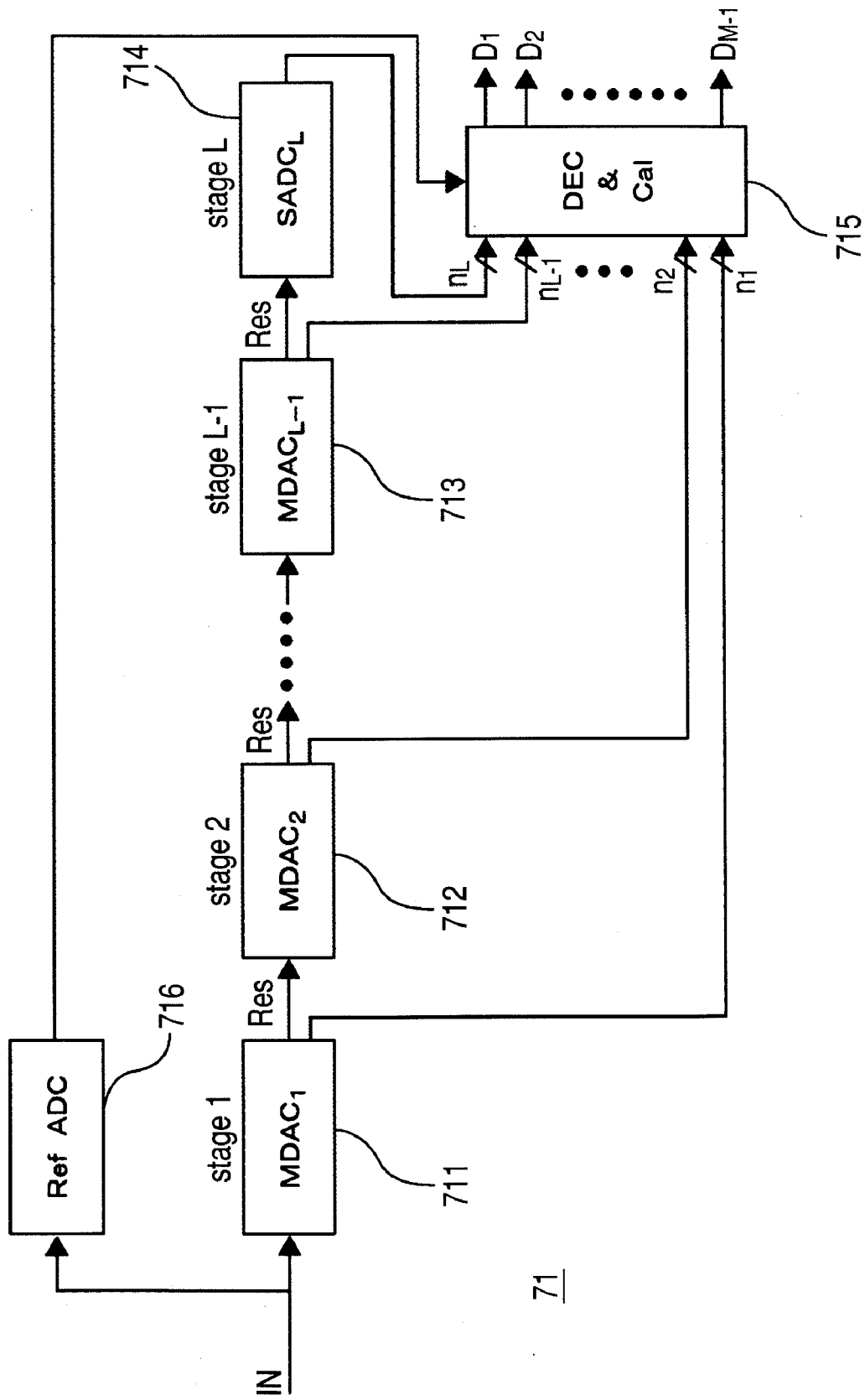
FIG. 14 is a drawing showing a construction of a main analog-digital conversion section in a seventh embodiment.

FIG. 14 shows a concrete construction of the main analog-digital conversion section 71. The first stage MDAC 711 of the main analog-digital conversion section 71 quantizes an analog signal voltage inputted to the analog-digital converter roughly with $n_1$ bits, transmits the result to the digital output generation & digital calibration section 715, and at the same amplifies a quantization error voltage (Res) occurring at that time to transfer it to the next stage MDAC 712 for processing commitment. The MDAC 712 quantizes the error voltage outputted from the MDAC 711 roughly with $n_2$ bits, transmits the result to the digital output generation & digital calibration section 715, and at the same amplifies a quantization error voltage occurring at that time to transfer it to the third stage MDAC. The same processing is performed below.

The last stage (L-th stage) simply includes a rough quantizer SDAC 714, which quantizes a quantization error voltage outputted from the preceding L-1-th stage MDAC 713 roughly with $n_L$ bits, and transmits the result to the digital output generation & digital calibration section 715.

The digital output generation & digital calibration section 715 determines a final digital output value by performing an inner product operation between values transmitted from each MDAC and appropriate weight trains obtained by digital calibration.

Output of the reference analog-digital conversion section 716 that is connected in parallel in terms of input shows a correct conversion result once N times (see FIG. 2) to the digital output generation & digital calibration section 715. Therefore, the digital output generation & digital calibration section 715 can get to a correct weight train by using it.

The main analog-digital conversion sections 72 and 73 also have the same construction as the main analog-digital conversion section shown in FIG. 14.

Improving matching accuracy between analog circuits of main analog-digital conversion sections described in the above embodiments means improving matching of the MDAC 711, MDAC 721, and MDAC 731, matching of the MDAC 712, MDAC 722, and MDAC 732, and matching of the MDAC 714, MDAC 724, and MDAC 734. Therefore, these MDACs of which matching accuracy is required need to be laid out on a chip to be in as close a position as physically possible.

Accordingly, in this embodiment, for example, each MDAC within each main analog-digital conversion section is laid out straightly to the same direction arrow direction the drawing), and these main analog-digital conversion sections are laid out on the RF-IC chip and ADC chip so that the each of first stages MDACs, the second stages MDACs, and N-th stages MDACs is aligned, and as close as possible. Thereby, the environment of MDACs of each stage is as similar as possible or identical so that the matching accuracy can be maximized.

Since the reference analog-digital conversion section 74 and the logical section 75 are not required critically in terms of layout, the main analog-digital conversion section may be laid out as required in a free space laid out as described above. In other words, the reference analog-digital conversion section 74, and the logical section 75 including the digital output generation section and the digital calibration section may be in positions distant from the main analog-digital conversion sections 71, 72, and 73.

In the above embodiments, as analog-digital converter of digital calibration type, types requiring a reference analog-digital conversion section are disclosed. However, also for other analog-digital converters not using the reference analog-digital converter unit, the embodiments of the present invention can also be applied. In that case, since the reference analog-digital conversion section does not exist, each main analog-digital conversion section shares only a digital calibration section, even in which case circuit area and power consumption are greatly reduced.

Eighth Embodiment

Figure 15:
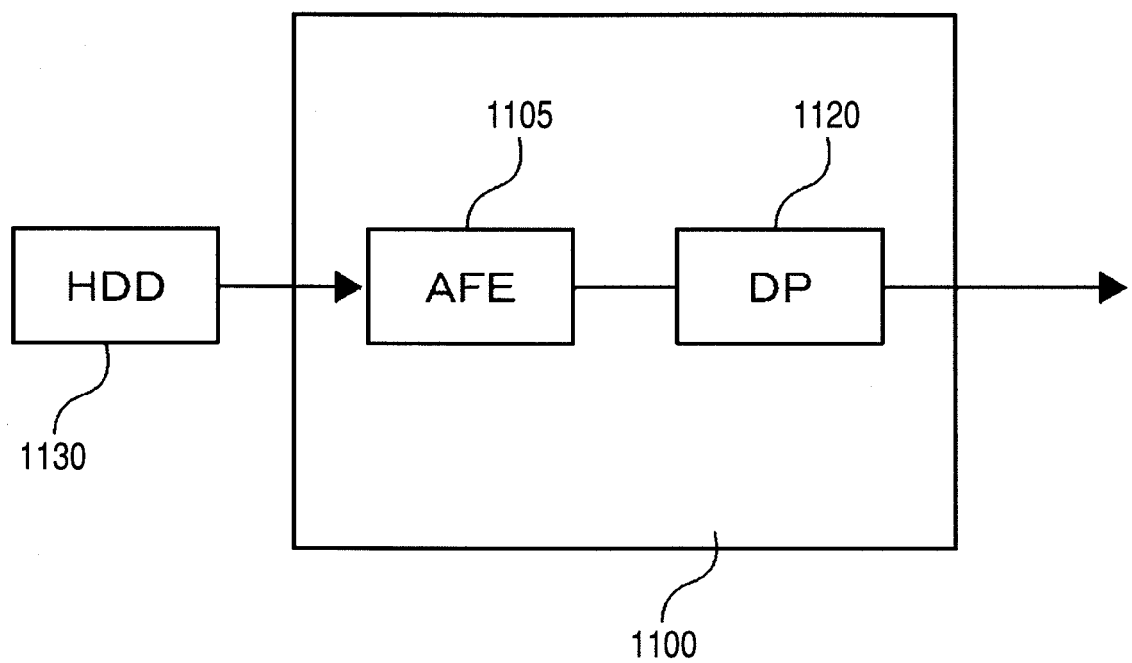
FIG. 15 is a block diagram showing an example of applying an analog-digital converter unit of digital calibration type of an eighth embodiment of the present invention to a wired communication system.
Figure 16:
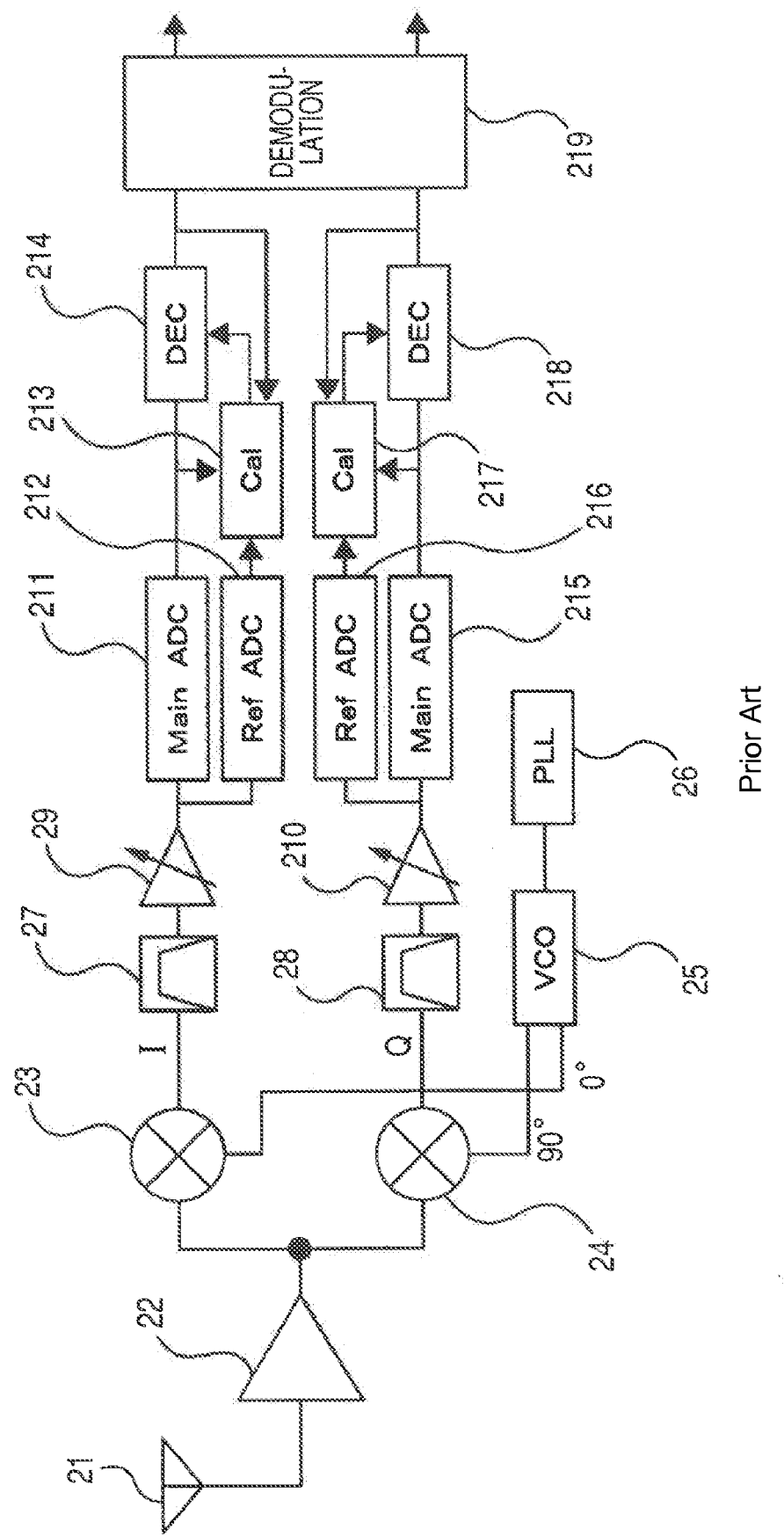
FIG. 16 is a drawing for explaining problems of the present invention.

An eighth embodiment of the present invention will be described with reference to FIG. 15. In this embodiment, an analog-digital converter unit of digital calibration type applies to a wired communication system. In FIG. 15, 1100 designates a signal processing LSI for e.g., HDD 1130, and includes an analog front end section 1105, and a digital signal processing circuit DP 1120. The analog front end section 1105 includes an analog-digital converter unit of digital calibration type of any embodiment of the present invention described previously. The same construction is taken for Ethernet (registered trademark) of 10 Gb or 100 Gb, and still the analog-digital converter unit of digital calibration type of any embodiment of the present invention described previously can be applied to the analog front end section 1105. Plural main analog-digital conversion sections constituting the analog-digital converter unit are disposed in adjacent positions.

According to this embodiment, since circuit area and current consumption of analog-digital converter in a wired communication system are greatly reduced, and appropriately calibrated output can be obtained, output of the analog-digital converter is kept highly accurate.

What is claimed is:

1. An analog-digital converter chip comprising an analog-digital converter of digital calibration type having a plurality of analog-digital converter units of digital calibration type,
wherein the plurality of analog-digital converter units of digital calibration type are formed on a common chip,
wherein the plurality of analog-digital converter units of digital calibration type share one reference analog-digital conversion section and one digital calibration section, and
wherein digital calibration is performed by applying a result of calibration performed for one of the analog-digital converter units of digital calibration type, by the reference analog-digital conversion section and the digital calibration section, to at least one other of the analog-digital converter units of digital calibration type.

2. The analog-digital converter chip according to claim 1, wherein each of the plurality of analog-digital converter units of digital calibration type includes a main analog-digital conversion section, and a digital output generation section connected to an output of the main analog-digital conversion section, the main analog-digital conversion section being formed on the common chip.

3. The analog-digital converter chip according to claim 2, wherein each of the main analog-digital conversion sections is constituted of an analog-digital conversion section of pipeline type, the analog-digital conversion section of pipeline type having a plural number of multiplying digital-to-analog converter (MDAC) stages connected in series.

4. The analog-digital converter chip according to claim 1, wherein the analog-digital converter of digital calibration type is an analog-digital converter of time interleave type in which the plurality of analog-digital converter units is K number of units, with K being a positive integer, the K analog-digital converter units having respective inputs connected to a common input of the analog-digital converter, having a same construction, and operating at an operation clock 1/K out of phase with each other.

5. The analog-digital converter chip according to claim 4, wherein said one of the analog-digital converter units is connected to the reference analog-digital conversion section and the digital calibration section, and said at least one of the other analog-digital converter units of digital calibration type is not directly connected to the reference analog-digital conversion section, each of the analog-digital converter units being constructed to generate a digital output based on a common weight coefficient $W_i$.

6. The analog-digital converter chip according to claim 1, wherein the plurality of analog-digital converter units of digital calibration type constitute an analog-digital converter portion of I side of a wireless receiving circuit and an analog-digital converter portion of Q side, and
wherein digital calibration of the analog-digital converter portions of the I and Q sides is performed by applying the result of calibration performed for the analog-digital converter portion of one of the I and Q sides to the analog-digital converter portion of the other of the I and Q sides.

7. The analog-digital converter chip according to claim 1, wherein each of said analog-digital converter units of digital calibration type has a main analog-digital conversion section and a digital output generation section,
wherein the analog-digital converter chip further comprises a changeover switch to connect the reference analog-digital conversion section and the digital calibration section to at least two of the analog-digital units of digital calibration type, selectively,
wherein the analog-digital converter chip alternates between a first operation mode and a second operation mode based on switching the changeover switch,
wherein, in the first operation mode, the digital calibration is performed with the reference analog-digital conversion section and the digital calibration section connected to one of the analog-digital converter units of digital calibration type, and
wherein, in the second operation mode, the digital calibration is performed with the reference analog-digital conversion section and the digital calibration section connected to another of the analog-digital converter units of digital calibration type.

8. The analog-digital converter chip according to claim 7, wherein the plurality of analog-digital converter units of digital calibration type are analog-digital converters that perform communication by a TDD signal, and
wherein one reception period Rx of the TDD signal includes alternating operation in the first and second operation modes.

9. The analog-digital converter chip according to claim 1, wherein the plurality of analog-digital converter units of digital calibration type are analog-digital converters of a wireless receiving circuit.

10. The analog-digital converter chip according to claim 1, wherein the analog-digital converters of digital calibration type are analog-digital converters of digital calibration type of a receiving circuit of a wired communication system.

11. An RF-IC chip, comprising:
a low-noise amplifier;
a mixer; and
an analog-digital converter that constitute a wireless receiving circuit,
wherein the low-noise amplifier, the mixer, and the analog-digital converter are formed on a common chip,
wherein the analog-digital converter is an analog-digital converter of digital calibration type having a plurality of analog-digital converter units of digital calibration type,
wherein the plurality of analog-digital converter units of digital calibration type share one reference analog-digital conversion section and one digital calibration section, and
wherein digital calibration is performed by applying a result of calibration performed for one of the analog-digital converter units of digital calibration type, by the reference analog-digital conversion section and the digital calibration section, to at least one other of the analog-digital converter units of digital calibration type.

12. The RF-IC chip according to claim 11,
wherein the wireless receiving circuit performs communication by a TDD system, and
wherein the calibration is performed by the digital calibration section only for a reception period Rx.

13. The RF-IC chip according to claim 11,
wherein the plurality of analog-digital converter units of digital calibration type constitute an analog-digital converter portion of I side of the wireless receiving circuit and an analog-digital converter portion of Q side, and
wherein a changeover switch is provided to connect the reference analog-digital conversion section and the digital calibration section to the analog-digital converter portion of I side and the analog-digital converter portion of Q side, selectively.

14. The RF-IC chip according to claim 11, wherein the analog-digital converter of digital calibration type is an analog-digital converter of time interleave type in which the plurality of analog-digital converter units is K number of units, with K being a positive integer, the K analog-digital converter units having respective inputs connected to a common input of the analog-digital converter, having a same construction, and operating at an operation clock 1/K out of phase with each other.

15. The RF-IC chip according to claim 11,
wherein the wireless receiving circuit performs communication by an FDD system, and
wherein the digital calibration is continuously performed by the digital calibration section.

16. An RF-IC chip, comprising a receiver and a transmitter that constitute a transceiver circuit,
wherein the receiver includes a low-noise amplifier, a mixer, and an analog-digital converter,
wherein the transmitter includes a power amplifier,
wherein the receiver and the transmitter are formed on a common IC substrate,
wherein the analog-digital converter of the receiver includes an analog-digital converter of digital calibration type having a plurality of analog-digital converter units of digital calibration type,
wherein the plurality of analog-digital converter units of digital calibration type are formed on a common chip,
wherein the plurality of analog-digital converter units of digital calibration type share one reference analog-digital conversion section and one digital calibration section, and
wherein digital calibration is performed by applying a result of calibration performed for one of the analog-digital converter units of digital calibration type, by the reference analog-digital conversion section and the digital calibration section, to at least one of the other analog-digital converter units of digital calibration type.

* * * * *